US008505468B2

(12) United States Patent
Yoshizawa et al.

(10) Patent No.: US 8,505,468 B2
(45) Date of Patent: Aug. 13, 2013

(54) SUBSTRATE ACCOMMODATING TRAY

(75) Inventors: Takenori Yoshizawa, Tsu (JP); Hiroto Shibata, Sendai (JP)

(73) Assignees: Sharp Kabushiki Kaisha, Osaka (JP); Sydek Corporation, Miyagi (JP)

( * ) Notice: Subject to any disclaimer, the term of this patent is extended or adjusted under 35 U.S.C. 154(b) by 1845 days.

(21) Appl. No.: 10/714,885

(22) Filed: Nov. 18, 2003

(65) Prior Publication Data
US 2004/0145697 A1    Jul. 29, 2004

(30) Foreign Application Priority Data

Nov. 19, 2002    (JP) ................................ 2002-335685
May 12, 2003    (JP) ................................ 2003-133753

(51) Int. Cl.
*B65D 19/38*      (2006.01)

(52) U.S. Cl.
USPC .......................... 108/53.1; 108/53.3; 206/562

(58) Field of Classification Search
USPC .............. 108/91, 53.1, 53.3, 57.25; 206/454, 206/557, 561, 562, 564; 248/346.01, 346.5; 220/646, 647, 506
See application file for complete search history.

(56) References Cited

U.S. PATENT DOCUMENTS

| | | | | |
|---|---|---|---|---|
| 385,085 A * | 6/1888 | Auth | ................................ | 217/36 |
| 2,532,109 A * | 11/1950 | Langel | ........................ | 220/23.2 |
| 3,502,241 A * | 3/1970 | Smith | .......................... | 220/23.6 |
| 5,103,976 A * | 4/1992 | Murphy | ........................ | 206/719 |
| 5,273,154 A * | 12/1993 | Braun | ............................ | 206/561 |
| 5,794,784 A * | 8/1998 | Murphy | ........................ | 206/725 |
| 6,053,466 A * | 4/2000 | Jordan et al. | .............. | 248/346.01 |
| 6,227,372 B1 * | 5/2001 | Thomas et al. | ................ | 206/725 |
| 6,626,634 B2 * | 9/2003 | Hwang et al. | .................. | 414/801 |
| 6,874,619 B1 * | 4/2005 | Hawkes | .......................... | 206/6.1 |
| 6,907,993 B2 * | 6/2005 | Wang | ............................. | 206/725 |
| 7,144,201 B2 * | 12/2006 | DeArmond, Jr. | .............. | 405/286 |
| 7,451,876 B2 * | 11/2008 | Bossi et al. | .................... | 206/534 |
| 2004/0000504 A1 * | 1/2004 | Wang | ............................ | 206/725 |

FOREIGN PATENT DOCUMENTS

| | | |
|---|---|---|
| JP | 10-287382 A | 10/1998 |
| TW | 444754 | 7/2001 |
| TW | 472760 | 1/2002 |
| TW | 519972 | 2/2003 |

* cited by examiner

*Primary Examiner* — Alfred J Wujciak
(74) *Attorney, Agent, or Firm* — Birch, Stewart, Kolasch & Birch, LLP

(57) ABSTRACT

A substrate accommodating tray for accommodating a substrate includes a frame including a pair of first frame portions facing each other and a pair of second frame portions facing each other; a plate-like support element provided in an area surrounded by the frame for supporting the substrate, the support element having a first opening provided between the pair of first frame portions; and at least one support member provided along the first opening between the pair of first frame portions for supporting the support element. The substrate is placed on an upper surface of the plate-like support element.

19 Claims, 12 Drawing Sheets

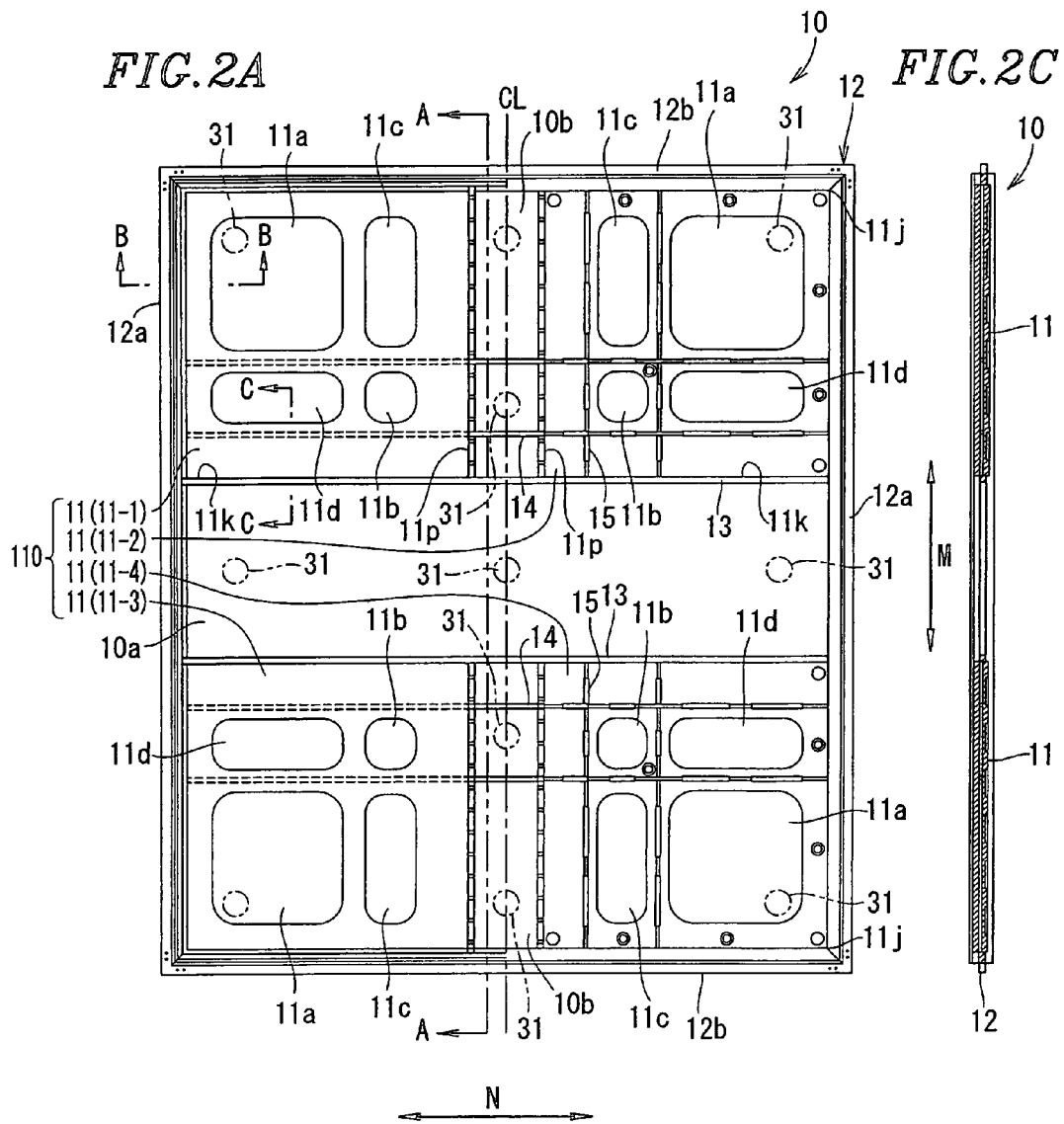

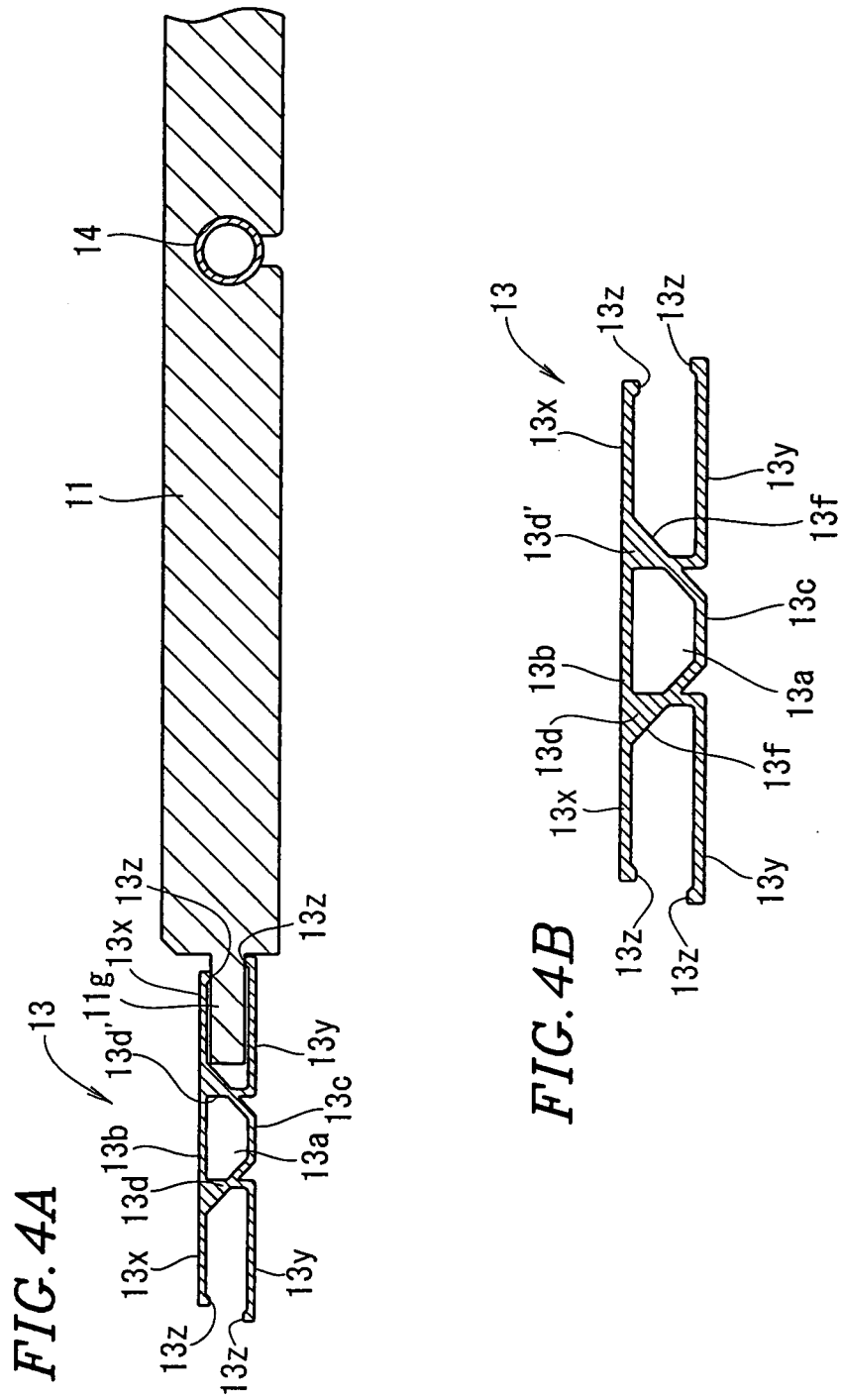

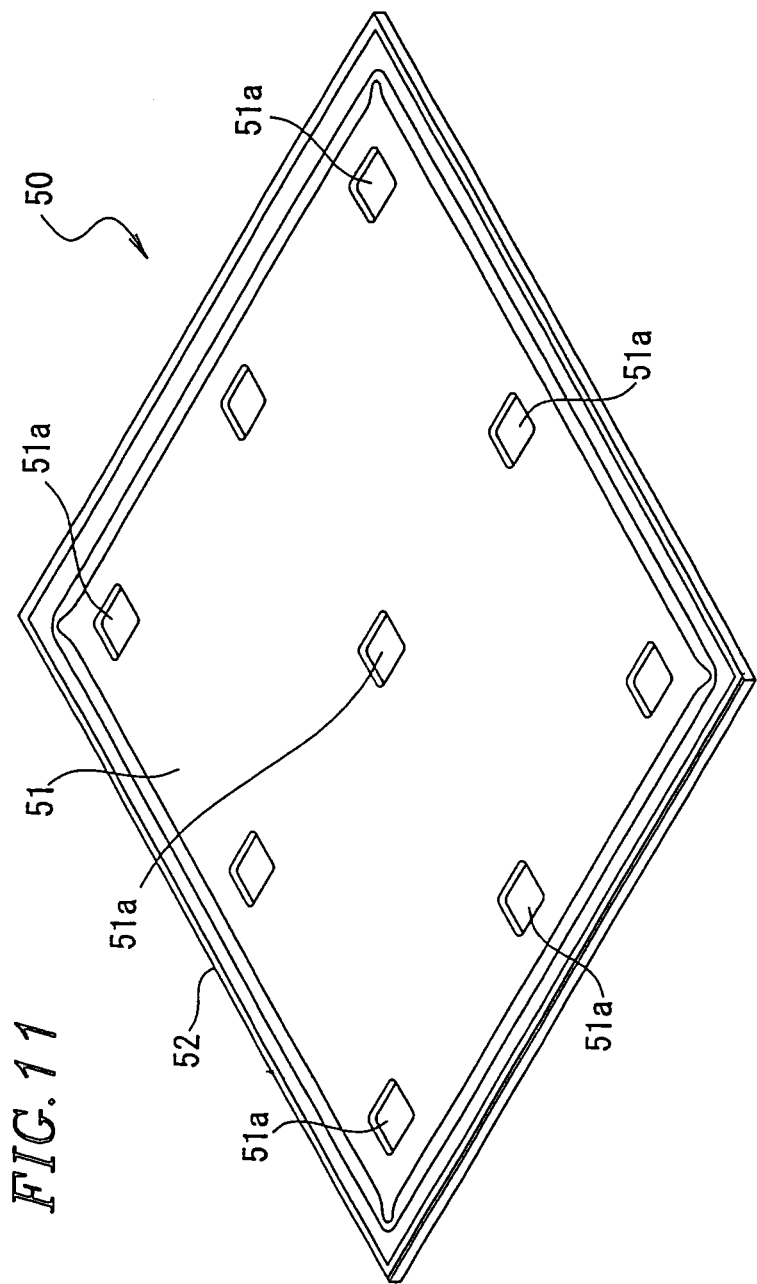

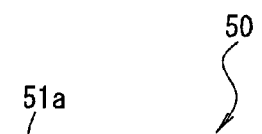
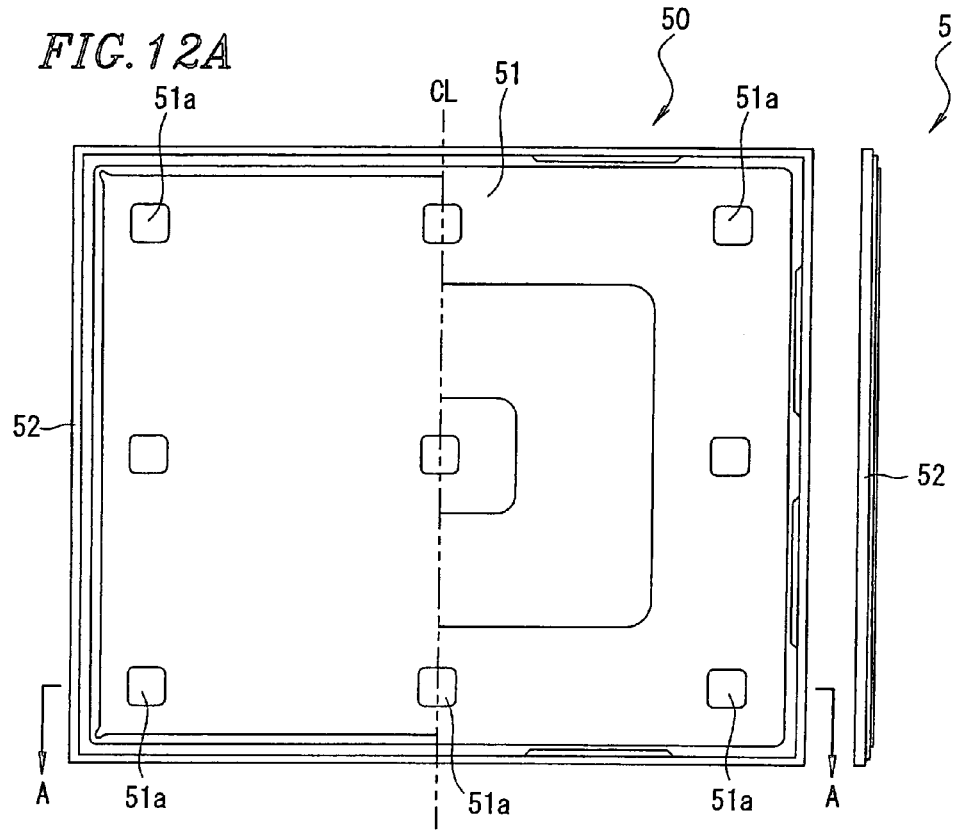
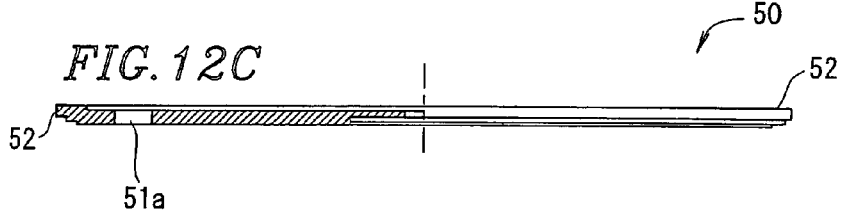
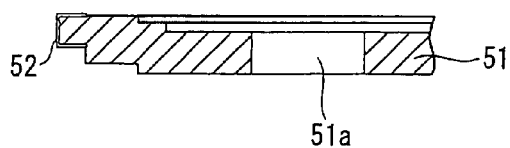

SUBSTRATE ACCOMMODATING TRAY

This Nonprovisional application claims priority under 35 U.S.C. §119(a) on Patent Application No(s). 2002-335685 and 2003-133753 filed in JAPAN on Nov. 19, 2002 and May 12, 2003, the entire contents of which are hereby incorporated by reference.

BACKGROUND OF THE INVENTION

1. Field of the Invention

The present invention relates to a substrate accommodating tray used for, for example, transporting or storing a square, rectangular or other-shaped substrate, such as a display glass substrate or the like which is used for producing a display panel for a liquid crystal display device or the like.

2. Description of the Related Art

A display panel for a liquid crystal display device usually includes a pair of display glass substrates opposed to each other and sealed together, and a liquid crystal material sealed between the pair of glass substrates. In order to produce such a display panel, glass substrates are transported to a display panel production plant. For transporting the glass substrates, a glass substrate accommodating box for accommodating a plurality of glass substrates is usually used. Glass substrates are used in display panels of various types of display devices as well as liquid crystal display devices. The above-mentioned type of glass substrate accommodating box is also used for transporting glass substrates used for the various types of display devices other than liquid crystal display devices.

The same type of glass substrate accommodating box is used for transporting glass substrates having electrodes and the like formed thereon as half-finished products, which will be used for producing display panels.

Recently, glass substrates having a thickness of 0.7 mm or less are widely used for various types of display panels. As the glass substrates are increasing in size, the planar area of the glass substrates which are carried to the display panel production plants is increasing, and even glass substrates having a side length of 1.3 m or greater are used.

Such a large and thin glass substrate easily warps. When a plurality of such glass substrates are vertically accommodated in a box spaces in between, the glass substrates may warp and contact each other and break during transportation. In order to avoid this, it is necessary to keep an appropriate distance between the glass substrates in the box.

For example, a glass substrate having a thickness of 0.7 mm and a side length of 1.3 m or greater, when supported along the periphery thereof with a support having a width of 20 to 30 mm in a vertical state may warp by 90 mm or greater at the center thereof. In a glass substrate accommodating box, it is necessary to keep a distance of 100 mm or greater between the glass substrates in the box.

A glass substrate is usually removed from a glass substrate accommodating box using a glass substrate adsorption hand. The glass substrate adsorption hand has a pair of flat adsorption pads. Each adsorption pad needs to be inserted between two adjacent glass substrates, which requires a space for inserting the adsorption pad. A flat adsorption pad usually has a thickness of about 20 mm. Therefore, the distance between the glass substrates in the box needs to be the sum of a distance sufficient for preventing the glass substrates from contacting each other even when the glass substrates warp and a distance of about 20 mm for inserting the adsorption pad.

Due to the necessary space between two adjacent glass substrates, the number of glass substrates which can be accommodated in a glass substrate accommodating box having a prescribed size is limited. This lowers the space efficiency for transportation and storage, i.e., the number of glass substrates which can be accommodated per unit volume.

A glass substrate having a side length of 1.3 m or greater weighs about 5 kg. A glass substrate accommodating box accommodating a large number of (for example, 20 or more) glass substrates may not be able to be carried by one worker.

In order to solve these problems, Japanese Laid-Open Publication No. 10-287382 discloses a substrate tray cassette for accommodating one glass substrate. A substrate accommodating section of the substrate tray cassette has a lattice structure. The substrate tray cassette is structured such that a plurality of substrate tray cassettes can be stacked vertically. Such a substrate tray cassette allows a large and thin glass substrate to be accommodated without warping and thus without breaking during transportation. Since a greater number of substrate tray cassettes can be stacked vertically for transportation and storage, the space efficiency can be improved.

However, this substrate tray cassette has the following problems. The accommodated glass substrate is supported by support pins, and a pair of adsorption pads of a glass substrate adsorption hand are put into the space below the glass substrate which is supported by the support pins. Such a space for the adsorption pads increases the size of the substrate tray cassette. In addition, the lattice structure of the substrate tray cassette presents a problem in terms of the rigidity thereof, and thus the number of substrate tray cassettes which can be stacked vertically is limited.

SUMMARY OF THE INVENTION

According to one aspect of the invention, a substrate accommodating tray for accommodating a substrate includes a frame including a pair of first frame portions facing each other and a pair of second frame portions facing each other; a plate-like support element provided in an area surrounded by the frame for supporting the substrate, the support element having a first opening provided between the pair of first frame portions; and at least one support member provided along the first opening between the pair of first frame portions for supporting the support element.

In one embodiment of the invention, the at least one support member is provided so as not to project over an upper surface of the support element.

In one embodiment of the invention, the support element has a second opening provided between the pair of second frame portions.

In one embodiment of the invention, the support element contains a foamed synthetic resin.

In one embodiment of the invention, the frame and the at least one support member each contain aluminum.

In one embodiment of the invention, the substrate accommodating tray further includes at least one reinforcing member for reinforcing the support element, the at least one reinforcing member being provided in the support element between the pair of first frame portions.

In one embodiment of the invention, the at least one reinforcing member is provided in the support element so as not to be exposed to an upper surface of the support element.

In one embodiment of the invention, the at least one reinforcing member includes an aluminum pipe.

In one embodiment of the invention, the support element further has a plurality of openings respectively provided in the vicinity of a plurality of corners of the frame.

In one embodiment of the invention, the support member includes a straight beam-like support body portion; a first upper flange portion provided at an upper position on one side of the support body portion; and a first lower flange portion provided at a lower position on the one side of the support body portion. The first upper flange portion and the first lower flange portion have a space therebetween.

In one embodiment of the invention, the support body portion has a trapezoidal cross-section.

In one embodiment of the invention, the support body portion is hollow.

In one embodiment of the invention, the support member further includes a reinforcing rib provided in the support body portion substantially vertically to a planar direction of the support element.

In one embodiment of the invention, the support member further includes a second upper flange portion provided at an upper position on the other side of the support body portion; and a second lower flange portion provided at a lower position on the other side of the support body portion. The second upper flange portion and the second lower flange portion have a space therebetween.

In one embodiment of the invention, the support body portion has a trapezoidal cross-section.

In one embodiment of the invention, the support body portion is hollow.

In one embodiment of the invention, the support member further includes a reinforcing rib provided in the support body portion substantially vertically to a planar direction of the support element.

In one embodiment of the invention, the pair of first frame portions are substantially parallel to each other. The pair of first frame portions and the pair of second frame portions are substantially perpendicular to each other. The frame is a quadrangular frame.

According to another aspect of the invention, a substrate accommodating tray for accommodating a substrate includes a frame including a pair of first frame portions facing each other and a pair of second frame portions facing each other; and a plate-like support element provided in an area surrounded by the frame for supporting the substrate.

In one embodiment of the invention, the support element has a plurality of openings respectively provided in the vicinity of a plurality of corners of the frame.

In one embodiment of the invention, the support element contains a foamed synthetic resin.

In one embodiment of the invention, the frame contains aluminum.

In one embodiment of the invention, the substrate accommodating tray further includes at least one reinforcing member for reinforcing the support element, the at least one reinforcing member being provided in the support element between the pair of first frame portions.

In one embodiment of the invention, the at least one reinforcing member is provided in the support element so as not to be exposed to an upper surface of the support element.

In one embodiment of the invention, the at least one reinforcing member includes an aluminum pipe.

According to the present invention, a plurality of substrate accommodating trays can be stacked vertically while each substrate accommodating tray accommodates one display substrate. Therefore, the substrates accommodated in the substrate accommodating trays do not contact each other.

Since the support element has a plurality of openings, the substrate accommodated in the tray may be removed using the removing pins which are inserted into the openings. Owing to such a structure, the substrate accommodating tray does not need to have any special space for inserting the adsorption pads from a side surface of the substrate accommodating tray. This reduces the thickness of the substrate accommodating tray and increases the space efficiency for transportation and storage.

When stacked vertically, a great number of substrate accommodating trays can be transported and stored as one unit. It is also possible to handle each substrate accommodating tray individually. For example, an individual substrate accommodating tray can be handled by only one worker. Thus, the substrate accommodating trays are easy to handle.

In addition, the support element provided for placing a substrate inside the frame improves the rigidity of the substrate accommodating tray. A thin and large-area substrate can be accommodated with certainty without warping. A great number of such substrate accommodating trays can be vertically stacked together.

Since the support element is divided into a plurality of parts, the substrate accommodating tray is lightweight and is produced at lower cost. The divided parts of the support element, which are connected by a support member, are prevented from being reduced in rigidity. Each part of the support element, even if reduced in thickness, is not warped. Thus, a thin and large-area substrate can be accommodated with certainty without warping.

The support member has an upper flange portion and a lower flange portion with a space therebetween on at least one side of the straight beam-like support body portion. The support member is thus increased in rigidity, and is prevented from warping. Since a side edge of the support element is in engagement between the upper flange portion and the lower flange portion, the support element is prevented with certainty from warping. As a result, even when a large-area and easily warped substrate is placed on the support element, the support element is prevented with certainty from warping.

Thus, the invention described herein provides a substrate accommodating tray for accommodating a great number of display substrates of glass or the like in a limited space and allowing the display substrates to be transported and stored with high efficiency without contacting each other; and a lightweight and highly rigid substrate accommodating tray for accommodating thin, large-area and thus easily warped substrates formed of for example, glass, so as to be prevented from warping with certainty.

These and other aspects of the present invention will become apparent to those skilled in the art upon reading and understanding the following detailed description with reference to the accompanying figures.

BRIEF DESCRIPTION OF THE DRAWINGS

FIG. 2A is a plan view/bottom view of the substrate accommodating tray shown in FIG. 1;

FIG. 2B is a side view of the substrate accommodating tray shown in FIG. 2A;

FIG. 2C is a cross-sectional view of the substrate accommodating tray shown in FIG. 2A taken along line A-A in FIG. 2A;

FIG. 4A is a partial cross-sectional view of the substrate accommodating tray shown in FIG. 2A;

FIG. 4B is a cross-sectional view of a support member of the substrate accommodating tray shown in FIG. 2A;

FIG. 11 is an isometric view of still another exemplary substrate accommodating tray according to the present invention;

FIG. 12A is a plan view/bottom view of the substrate accommodating tray shown in FIG. 11;

FIG. 12B is a side view of the substrate accommodating tray shown in FIG. 12A;

FIG. 12C is a cross-sectional view of the substrate accommodating tray shown in FIG. 12A taken along line A-A in FIG. 12A; and FIG. 12D is a partial enlarged view of FIG. 12C.

DETAILED DESCRIPTION OF THE INVENTION

Hereinafter, the present invention will be described by way of illustrative examples with reference to the accompanying drawings.

Figure 1:
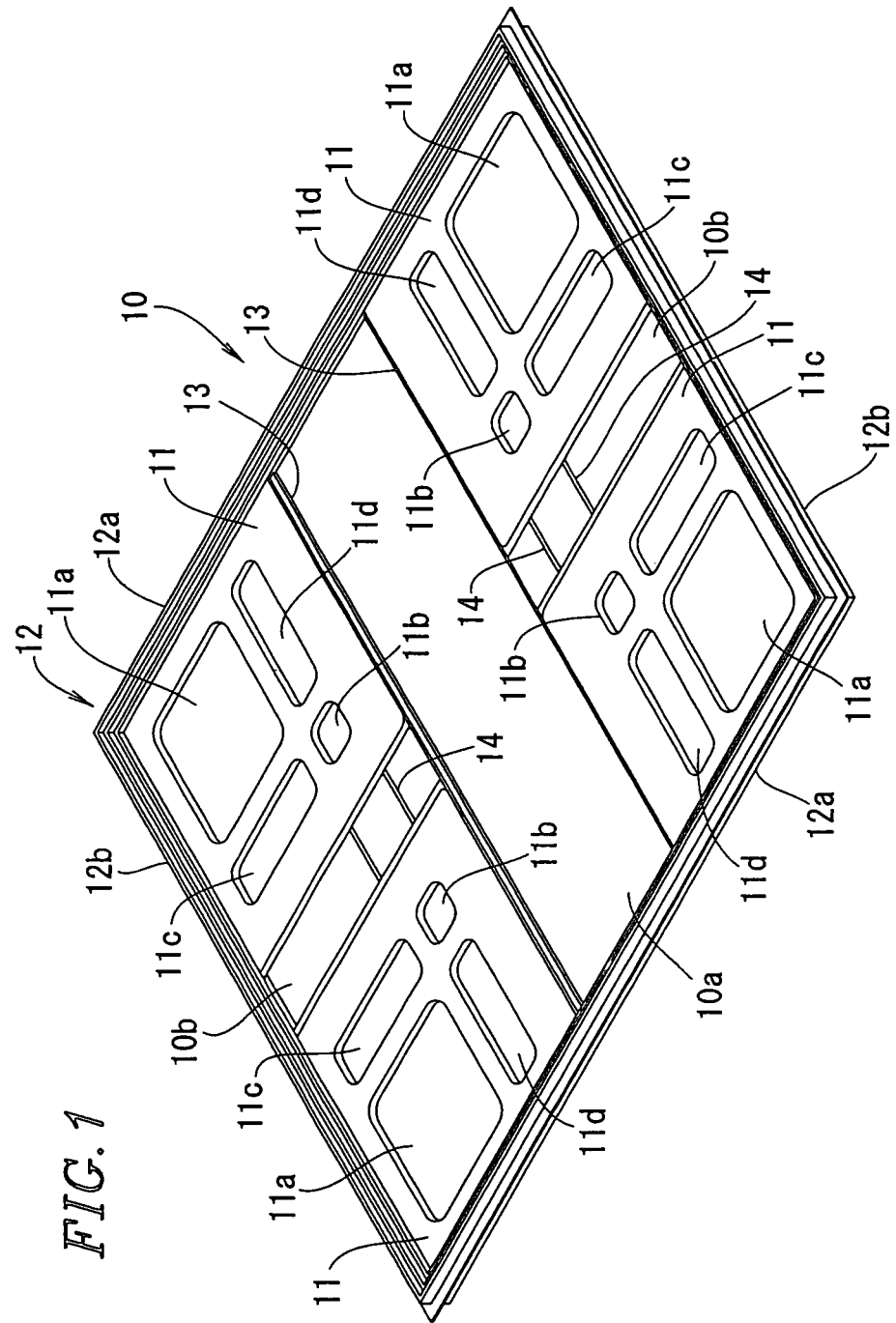
FIG. 1 is an isometric view of an exemplary substrate accommodating tray according to the present invention.

FIG. 1 is an isometric view of one exemplary substrate accommodating tray 10 according to the present invention. FIG. 2A is a plan view/bottom view thereof, FIG. 2B is a side view thereof, and FIG. 2C is a cross-sectional view thereof taken along line A-A in FIG. 2A. In FIG. 2A, the left part from the central chain line CL shows the plan view, and the right part from the central chain line CL shows the bottom view.

The substrate accommodating tray 10 is used for accommodating and transporting a quadrangular glass substrate 20 (FIGS. 3A and 3B) used for a liquid crystal display panel, specifically a rectangular or square glass substrate having a side of 1.3 m or greater and a thickness of 0.7 mm or less.

The substrate accommodating tray 10 includes a quadrangular frame 12 and a plate-like support element 110 including four substantially flat support parts 11 (or divided into four substantially flat support parts 11) located at four corners of an area surrounded by the frame 12. One glass substrate is to be horizontally placed on the four support parts 11.

In this example, the longer side direction of the frame 12 (represented by arrow M) will be referred to as the "longitudinal direction", and the shorter side direction of the frame 12 (represented by arrow N) will be referred to as the "width direction". The longitudinal direction and the width direction are perpendicular to each other.

The frame 12 includes a pair of longitudinal direction portions 12a provided along the longitudinal direction of the substrate accommodating tray 10 and a pair of width direction portions 12b provided along the width direction of the substrate accommodating tray 10. The pair of longitudinal direction portions 12a face each other, and the pair of width direction portions 12b face each other. In this example, the pair of longitudinal direction portions 12a are substantially parallel to each other. The pair of longitudinal direction portions 12a and the pair of width direction portions 12b are substantially perpendicular to each other. Each longitudinal direction portion 12a and each width direction portion 12b which are adjacent to each other are connected via a connection member and a rivet (not shown).

Each support part 11 is shaped as a flat plate and is square. Each support part 11 has a thickness of about 15 mm and is formed of a foamed synthetic resin material, for example, elastic foamed polyethylene. The four support parts 11 have an identical structure, and are provided inside the frame 12 such that each support part 11 is engaged with the corresponding corner of the frame 12.

For the sake of explanation, referring to FIG. 2A, the support part 11 at the upper left section is labeled 11-1 the support part 11 at the upper right section is labeled 11-2, the support part 11 at the lower left section is labeled 11-3, and the support part 11 at the lower right section is labeled 11-4.

The support element 110 has a first opening 10a (first gap) and a second opening 10b (second gap). The first opening 10a extends in the width direction, between central positions of the pair of longitudinal direction portions 12a. The four support parts 11 are arranged such that the support parts 11-1 and 11-2 are separated from the support parts 11-3 and 11-4 by the first opening 10a. The size of the first opening 10a in the longitudinal direction is uniform.

Figure 8:
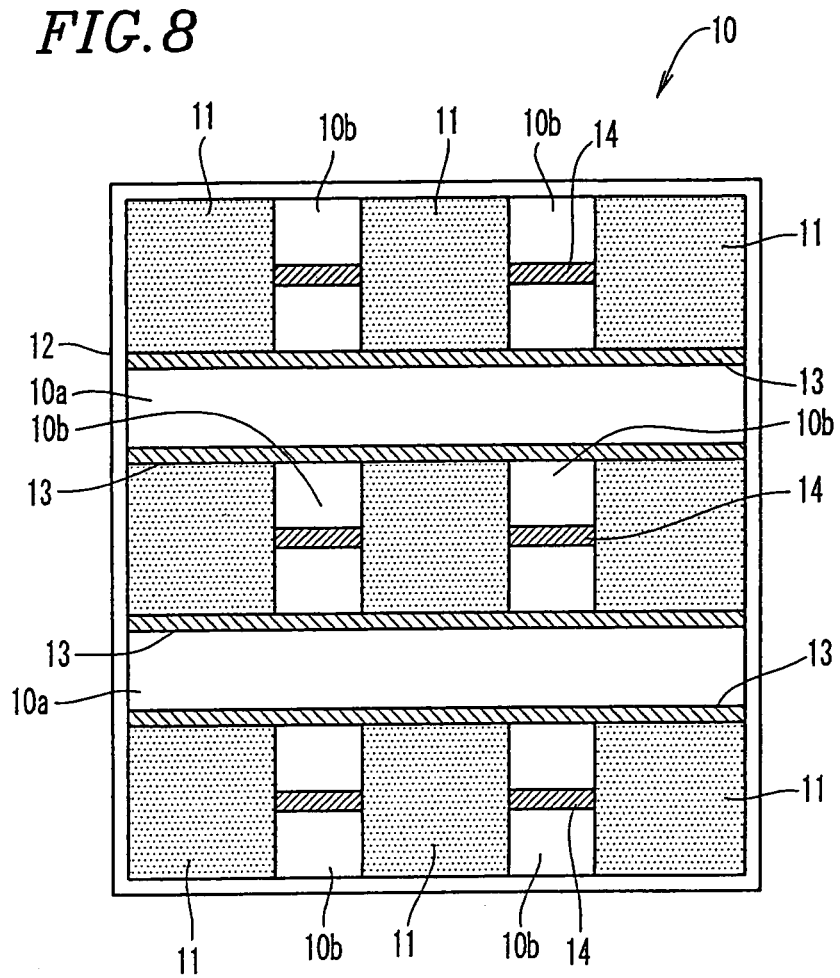
FIG. 8 is a plan view/bottom view of still another exemplary substrate accommodating tray according to the present invention.

The support element 11 and the frame 12 do not need to be engaged with each other, and may be integrally molded. The position of the first opening 10a in the longitudinal direction is not limited to the center thereof. For example, the first opening 10a may be located as shown in FIG. 8. The pair of longitudinal direction portions 12a do not need to be substantially parallel to each other. The pair of longitudinal direction portions 12a and the pair of width direction portions 12b do not need to be perpendicular to each other. The frame 12 does not need to be a quadrangular frame, and may be, for example, a hexagonal or octagonal frame.

The substrate accommodating tray 10 further includes at least one support member 13 for supporting the support element 110 such that the support element 110 does not warp. In this example, the support member 13 is provided on the support element 10 along the first opening 10a, between the pair of longitudinal frame portions 12a.

As described above, the support element 110 has the second opening 10b, which extends in the longitudinal direction, between central positions of the pair of width direction frame portions 12b. The support parts 11-1 and 11-2 are separated from each other by the second opening 10b, and the support parts 11-3 and 11-4 are also separated from each other by the second opening 10b. The size of the second opening 10b in the width direction is uniform. The size of the second opening 10b in the width direction is smaller than the size of the first opening 10a in the longitudinal direction.

Each support part 11 has a substantially square first opening portion 11a in the vicinity of the corresponding corner of the frame 12. One of the four corners of each first opening portion 11a is aligned with a corner 11 of the support part 11 which is engaged with the corresponding corner of the frame 12; i.e., two longitudinal sides of each first opening portion 11a are parallel to the longitudinal direction portions 12a, and two width direction sides of each first opening portion 11a are parallel to the width direction portions 12b. Each first opening portion 11a is slightly larger than ¼ of the area of each support part 11. Each support part 11 also has a substantially square second opening portion 11b on the diagonal line of the support part 11 running through the corner 11j. The first opening portion 11a is located between the corner 11j and the second opening portion 11b on the diagonal line.

Each support part 11 has a substantially rectangular third opening portion 11c between the first opening portion 11a and the second opening 10b. The third opening portion 11c is longer in the longitudinal direction of the frame 12. Each support part 11 has a substantially rectangular fourth opening portion 11d between the first opening portion 11a and the first opening 10a. The fourth opening portion 11d is longer in the width direction of the frame 12. The longer sides of the third opening portion 11c and the longer sides of the fourth opening portion 11d have substantially the same length as that of each side of the first opening portion 11a. The shorter sides of the third opening portion 11c and the shorter sides of the fourth opening portion 11d have substantially the same length as that of each side of the second opening portion 11b. The second opening portion 11b is located on an extended line from the longer axis of third opening portion 11c, and also on an extended line from the longer axis of the fourth opening portion 11d.

Figure 3A:
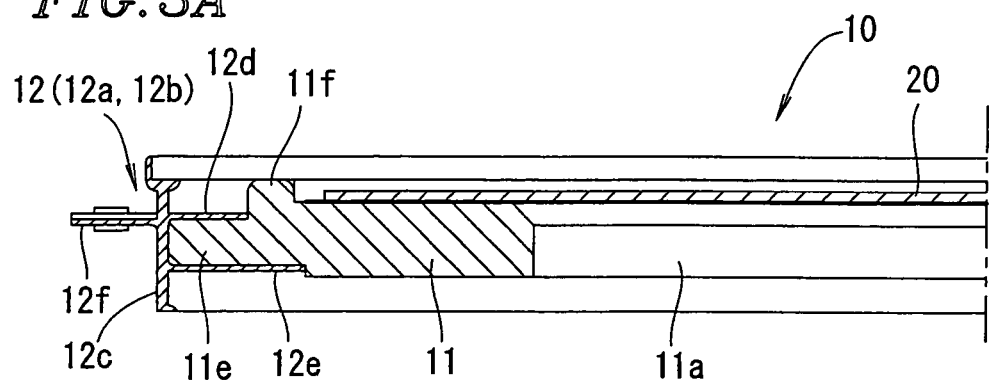
FIG. 3A is a partial cross-sectional view of the substrate accommodating tray shown in FIG. 2A.

FIG. 3A is a cross-sectional view of the substrate accommodating tray 10 taken along line B-B in FIG. 2A. Although the cross-sectional view shown in FIG. 3A shows the longitudinal direction portion 12a of the frame 12, the width direction portion 12b of the frame 12 has substantially the same cross-sectional structure.

Each support part 11 includes a frame engaging portion 11e. Although FIG. 3A shows the frame engaging portion 11e provided along the edge of the support part 11 along the longitudinal direction portion 12a of the frame 12, the support part 11 has a frame engaging portion 11e also along the edge of the support part 11 along the width direction portion 12b of the frame 12. The support part 11 is engaged with the longitudinal direction portion 12a and the width direction portion 12b via each frame engaging portion 11e. The frame engaging portion 11e has a horizontal upper surface and a horizontal lower surface and thus has a uniform thickness. The support part 11 has an upper projection portion 11f which projects upward from the upper surface of the frame engaging portion 11e. Inside the upper projection portion 11f, the support part 11 has an upper surface which is at a higher level than the upper surface of the frame engaging portion 11e and at a lower level than an upper surface of the upper projection portion 11f. On this upper surface inside the upper projection portion 11f, a glass substrate 20 is to be placed.

The longitudinal direction portion 12a and the width direction portion 12b have substantially the same cross-sectional structure as described above, and are formed by molding aluminum or the like. The longitudinal direction portion 12a and the width direction portion 12b each include a strip-shaped frame body portion 12c along the entire length thereof. The frame body portion 12c is vertical to the upper surface and the lower surface of the frame engaging portion 11e and is in contact with a side surface of the frame engaging portion 11e. The frame body portion 12c extends upward from the upper surface of the frame engaging portion 11e and downward from the lower surface of the frame engaging portion 11e. A bottom end of the frame body portion 12c is lower than a lower surface of the support part 11.

Each of the longitudinal direction portion 12a and the width direction portion 12b includes an upper surface engaging portion 12d and a lower surface engaging portion 12e projecting inward. The upper surface engaging portion 12d and the lower surface engaging portion 12e extend along the entire length of each of the longitudinal direction portion 12a and the width direction portion 12b. The upper surface engaging portion 12d is in contact with the upper surface of the frame engaging portion 11e, and the lower surface engaging portion 12e is in contact with the lower surface of the frame engaging portion 11e. The lower surface engaging portion 12e extends slightly further inward than the upper surface engaging portion 12d. Each of the longitudinal direction portion 12a and the width direction portion 12b includes a flange 12f along the entire length thereof. The flange 12f projects outward. The flange 12f is at substantially the same level as the upper engaging portion 12d but projects in the opposite direction. The flange 12f is, for example, to be engaged with chucks or claws of a chucking device when the substrate accommodating tray 10 is horizontally transported.

Figure 3B:
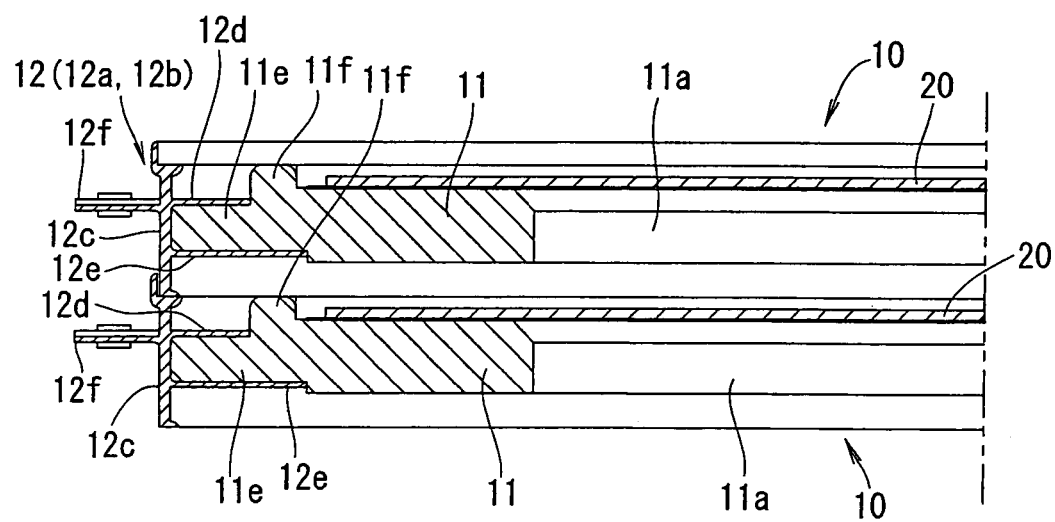
FIG. 3B is a partial cross-sectional view of a plurality of substrate accommodating trays vertically stacked together, each of which is shown in FIG. 2A.

The substrate accommodating tray 10 is structured such that a plurality of substrate accommodating trays 10 can be vertically stacked. For vertically stacking the plurality of substrate accommodating trays 10, as shown in FIG. 3B, the bottom end of the frame body portion 12c of the frame 12 of an overlying substrate accommodating tray 10 is engaged with, and thus is supported by, a top end of the frame body portion 12c of the frame 12 of an underlying substrate accommodating tray 10. The above-mentioned top end and the bottom end can be positioned to each other.

FIG. 4A is a cross-sectional view of the substrate accommodating tray 10 taken along line C-C in FIG. 2A. Each support element 11 includes a support member engaging portion 11g. The support member engaging portion 11g is provided along the entire length of an edge 11k of the support element 11 which runs along the first opening 10a. The support member engaging portion 11g projects into the first opening 10a from side surfaces of the edges 11k of the support parts 11, at the center in the thickness direction. The support member engaging portion 11g is thinner than the rest of the support part 11 on which the glass substrate 20 is to be placed, and has a rectangular cross-section. Therefore, an upper surface of the support member engaging portion 11g is at a lower level than the upper surface of the rest of the support part 11, and a lower surface of the support member engaging portion 11g is at a higher level than the lower surface of the rest of the support part 11.

The support member 13 is attached to the support member engaging sections 11g of each pair of support parts 11 arranged side by side along the width direction frame 12b (i.e., one support member 13 is attached to the support member engaging sections 11g of the support parts 11-1 and 11-2, and another support member 13 is attached to the support member engaging sections 11g of the support parts 11-3 and 11-4). Each support member 13 is suspended by the corresponding support member engaging sections 11g.

FIG. 4B is an enlarged view of each support member 13. The support member 13 includes a linear beam-shaped support body portion 13a having a trapezoidal cross-section and a hollow portion, and two upper flange portions 13x and two lower flange portions 13y. The upper flange portions 13x are provided at upper positions on both sides of the support body portion 13a, and the lower flange portions 13y are provided at lower positions on both sides of the support body portion 13a. The upper flange portion 13x and the lower flange portion 13y on each side are parallel to each other with a certain distance therebetween. The upper flange portion 13x and the lower flange portion 13y may be provided only on one side of the support body portion 13a.

The support body portion 13a includes a horizontal upper portion 13b and a lower portion 13c provided below the upper portion 13b. The lower portion 13c is parallel to the upper portion 13b with a certain distance therebetween. The upper portion 13b is wider than the lower portion 13c. The lower portion 13c faces the central portion of the upper portion 13b. Edges of the upper portion 13b and corresponding edges of the lower portion 13c are respectively connected to each other by triangular portions 13d and 13d'. In the cross-section shown in FIG. 4B, the triangular portions 13d and 13d' are symmetric. The triangular portions 13d and 13d' each have a slanting surface 13f, which is slanting at 45 degrees with respect to the horizontal direction.

As described above, the upper portion 13b is wider than the lower portion 13c. The upper flange portions 13x each project outward horizontally from the upper portion 13b by a prescribed distance, so as to form a substantially flat plane together with the upper portion 13b. The lower flange portions 13y each extend downward from a lower position of the triangular portions 13d or 13d', and are bent and extend horizontally outward so as to be within the same horizontal plane as the lower surface 13c. An outer edge of each lower flange portion 13y is external with respect to an outer edge of the corresponding upper flange portion 13x. The outer edge of each upper flange portion 13x has an engaging projection 13z projecting downward. The outer edge of each lower flange portion 13y has an engaging projection 13z projecting upward.

The support member engaging portion 11g of the support part 11 is inserted between the upper flange portion 13x and the lower flange portion 13y provided on one side of the support body portion 13a, so that the support member 13 is in engagement with the support member engaging portion 11g. Ends of the support member 13 in the width direction (N in FIG. 2A) are respectively connected to the longitudinal direction portions 12a by a rivet. An upper surface of the upper flange portion 13x is at a lower level than the upper surface of the rest of the support part 11, and a lower surface of the lower flange portion 13y is at a higher level than the lower surface of the rest of the support part 11.

Referring to FIGS. 2A and 4A, the substrate accommodating tray 10 further includes at least one reinforcing member 14 for reinforcing the support parts 11. In FIG. 2A, each pair of support parts 11 arranged side by side in the width direction (i.e., the support parts 11-1 and 11-2, and the support parts 11-3 and 11-4) has a pair of reinforcing members 14 running therein. The reinforcing members 14 extend between the longitudinal direction portions 12a of the frame 12, and are parallel to the support member 13. The reinforcing members 14 are exposed outside in the second opening 10b.

In each pair of support parts 11 mentioned above (for example, the support parts 11-1 and 11-2), one of the reinforcing members is positioned between the edges 11k along the first opening 10a and the second opening portions 11b/the fourth opening portions 11d, and is closer to the second opening portions 11b/the fourth opening portions 11d. The other reinforcing member is positioned between the second opening portions 11b/the fourth opening portions 11d and the first opening portions 11a/the third opening portions 11c.

Each support part 11 has another pair of reinforcing members 15 running therein. The reinforcing members 15 extend along the entire length of the support part 11 in the longitudinal direction (M in FIG. 2A) and perpendicular to the reinforcing members 14. One of the reinforcing members 15 is positioned between an edge 11p along the second opening 10b and the third opening portion 11c/the second opening portion 11b, and is closer to the third opening portion 11c/the second opening portion 11b. The other reinforcing member 15 is positioned between the third opening portion 11c/the second opening portion 11b and the first opening portion 11a/the fourth opening portion 11d.

The reinforcing members 14 and 15 are, for example, aluminum pipes and are provided for increasing the rigidity of the corresponding support parts 11. The support member 13 may also be formed of aluminum.

Each reinforcing member 14 and each reinforcing member 15 are provided in grooves formed in the support parts 11. The grooves run in both the longitudinal direction and the width direction in the support parts 11 and are opened in the lower surfaces of the support parts 11. Each reinforcing member 14 and each reinforcing member 15 are pushed into the groove through the opening, utilizing the elasticity of the support part 11. The reinforcing members 14 and 15 are provided in the support parts 11 so as not to be exposed to the top surface of the support part 11 on which a glass substrate 20 (FIGS. 3A and 3B) is to be placed.

The substrate accommodating tray 10 having the above-described structure can accommodate, for example, a glass substrate 20 (FIGS. 3A and 3B) having a thickness of 0.7 mm or less and a side length of 1300 mm or greater. The glass substrate 20 is used for, for example, a liquid crystal display panel. One glass substrate 20 is placed on the upper surfaces of the four plate-like support parts 11. A rear surface of the glass substrate 20, which is opposite to a surface having electrodes and the like formed thereon, is in contact with the upper surfaces of the plate-like support parts 11.

Since each support part 11 is formed of an elastic foamed synthetic resin material, for example, foamed polyethylene, the glass substrate 20 is prevented from being broken by impact applied to the substrate accommodating tray 10 during transportation.

As described above, the four support parts 11 are separated from each other by the first opening 10a or the second opening 10b having an appropriate size. The size of the first opening 10a in the longitudinal direction (M in FIG. 2A) and the size of the second opening 10b in the width direction (N in FIG. 2A) are set such that a glass substrate 20 having a thickness of 1 mm or less can be supported without warping. The provision of the first opening 10a and the second opening 10b between the adjacent support parts 11 reduces the weight of the entirety of the substrate accommodating tray 10. The provision of the first opening 10a and the second opening 10b also reduces the amount of the material necessary for producing the substrate accommodating tray 10, and thus decreases the production cost of the substrate accommodating tray 10.

The support element 110 contains a foamed synthetic resin material such as a foamed polyethylene resin or the like. The four support parts 11 formed of such a foamed synthetic resin, for example, foamed polyethylene are engaged with, and thus integrated with, the frame 12 formed of, for example, aluminum. Therefore, the entirety of the substrate accommodating tray 10 has a high rigidity.

The support parts 11-1 and 11-2 are connected to each other by the support member 13, and the support parts 11-3 and 11-4 are connected to each other by the support member 13. Thus, the support parts 11 are also rigidly connected to each other. Therefore, even when each support member 11 is increased in area in order to support a thinner and larger glass substrate 20, the support parts 11 are prevented from warping and stably support such a thinner and larger glass substrate 20.

The support member 13 includes the upper flange portions 13x and the lower flange portions 13y on both sides of the linear beam-like support body portion 13a. As compared to the case where an upper flange portion and a lower flange portion are provided on only one side, the amount of warp of the support member 13 at the center of the width direction (N in FIG. 2A) can be reduced. By the engagement of the upper flange portion 13x and the lower flange portion 13y provided on one side of the support body portion 13a with the support member engaging portions 11g of the support parts 11 arranged side by side in the width direction (N in FIG. 2A), the support parts 11 are prevented with certainty from warping downward.

The upper flange portions 13x and the lower flange portions 13y are provided within the thickness of the support parts 11. The upper flange portions 13x are engaged with the support parts 11 so as not to project from the upper surface of the support parts 11. Therefore, the upper flange portions 13x do not contact the glass substrate 20 placed on the support parts 11 while preventing the support parts 11 from warping.

Each pair of the support parts 11 connected to the support member 13 have a pair of reinforcing members 14 running therethrough. This reinforces the connection of the support parts 11 and also increases the rigidity of each support part 11.

Referring to FIG. 3B, the substrate accommodating trays 10 each accommodating a glass substrate 20 are transported while being vertically stacked. The top end of the frame body portion 12c of an underlying substrate accommodating tray 10 and the bottom end of the frame body portion 12c of an overlying substrate accommodating tray 10 are positioned and engaged with respect to each other. Therefore, the substrate accommodating trays 10 vertically stacked are not horizontally displaced with respect to each other.

An upper surface of the glass substrate 20 placed on the support parts 11 is at a lower level than the top end of the frame body portion 12c of the frame 12. Therefore, the upper surface of the glass substrate 20 accommodated in an underlying substrate accommodating tray 10 does not contact an overlying substrate accommodating tray 10.

As described above, the substrate accommodating tray 10 according to the present invention can transport and store a great number of glass substrates 20 with significantly improved space efficiency.

The substrate accommodating tray 10 according to the present invention is lightweight and rigid, and can stably accommodate a thin and large glass substrate 20 horizontally without warping.

The glass substrate 20 is removed from the substrate accommodating tray 10 as follows.

Referring to FIG. 2A, removing pins 31 are inserted into the first opening 10a, the second opening 10b, and the first opening portion 11a from the lower surfaces of the support parts 11. For example, four removing pins 31 are respectively inserted into the four first opening portions 11a in the vicinity of the four corners of the frame 12; three removing pins 31 are inserted into the first opening 10a linearly at an equal interval in the width direction (N in FIG. 2A); and four removing pins 31 are inserted into the second opening 10b (two removing pins 31 between the support parts 11-1 and 11-2 and two removing pins 31 between the support parts 11-3 and 11-4). The four removing pins 31 in the second opening 10b and the removing pin 31 at the center of the first opening 10a are located linearly in the longitudinal direction (M in FIG. 2A) at an equal interval. The glass substrate 20 is raised by these removing pins 31. Thus, the glass substrate 20 is removed from the substrate accommodating tray 10.

FIGS. 5A through 5D are cross-sectional views of various alternative support members usable for the substrate accommodating tray 10 according to the present invention.

Figure 5A:
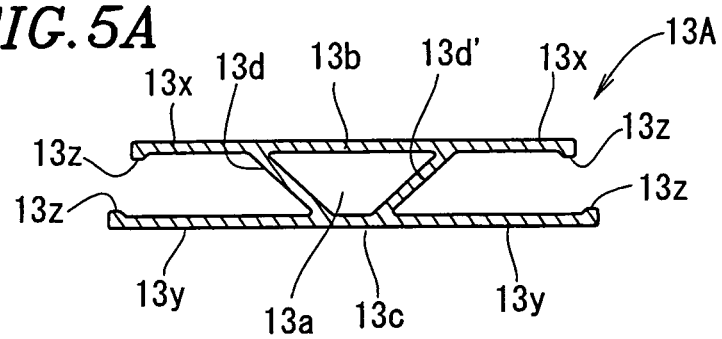
FIGS. 5A through 5D show other exemplary support members usable for the substrate accommodating tray shown in FIG. 2A.

FIG. 5A shows a support member 13A. The support member 13A is mainly different from the support member 13 shown in FIG. 4B on the following point. The lower flange portions 13y are continued directly from the lower portion 13c of the support body portion 13a, so as to form a substantially flat plane together with the lower portion 13c. On the other points, the support member 13A is substantially the same as the support member 13 shown in FIG. 4B.

The amount of warp of the support member 13A is smaller than the support member 13. However, when produced by extrusion molding, the support member 13 is preferable to the support member 13A for the following reasons.

A support member produced by extrusion molding may be deformed while being cooled after molding. The support member 13 has recessed portions between the lower portion 13c and the lower flange portions 13y. When cooling the support member 13, the support member 13 is placed on a table having projections corresponding to the recessed portions in the state where the projections and recessed portions are in engagement with each other. Thus, the deformation of the support member 13 can be suppressed. By contrast, the support member 13A does not have such recesses, and therefore the lower portion 13c is easily curved while being cooled. For this reason, the support member 13 is preferable when produced by extrusion molding.

Figure 5B:
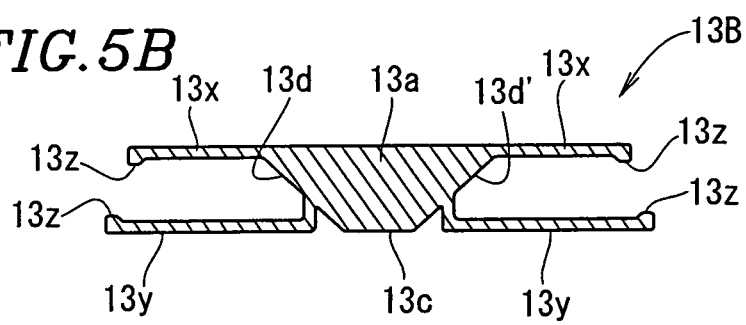

FIG. 5B shows a support member 13B. The support member 13B is substantially the same as the support member 13 shown in FIG. 4B except that the support body portion 13a of the support member 13B is solid. The amount of warp of the support member 13B is smaller than that of the support member 13. Accordingly, the amount of warp of the support part 11 supported by the support member 13B is smaller than that by the support member 13. However, the support member 13B is heavier than the support member 13 by the solid support body portion 13a. As long as the amount of warp is sufficiently small, the support member 13 is preferable to the support member 13B.

Figure 5C:
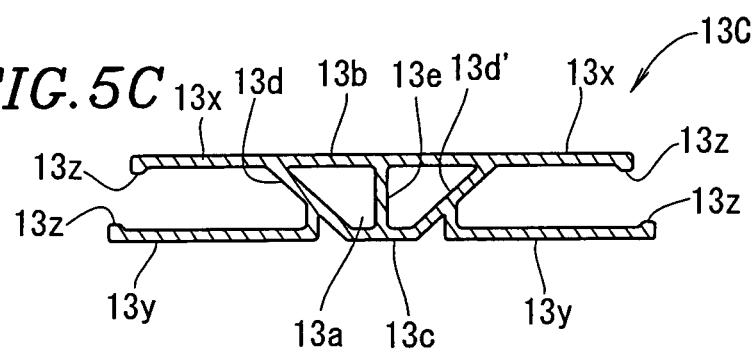

FIG. 5C shows a support member 13C. The support member 13C is mainly different from the support member 13 shown in FIG. 4B on the following point. In the support member 13C, a central part of the upper portion 13b and a central part of the lower portion 13c are connected to each other by a reinforcing rib 13e extending substantially perpendicular to the upper portion 13b and the lower portion 13c. The support body portion 13a has hollow portions which are symmetrical with respect to the reinforcing rib 13e. On the other points, the support member 13C is substantially the same as the support member 13 shown in FIG. 4B.

The amount of warp of the support member 13C is larger than that of the support member 13B but is smaller than that of the support member 13. However, the support member 13C is more difficult to produce and heavier than the support member 13 due to the reinforcing rib 13e. As long as the amount of warp of the support member 13 is sufficiently small, the support member 13 is preferable to the support member 13C.

Figure 5D:
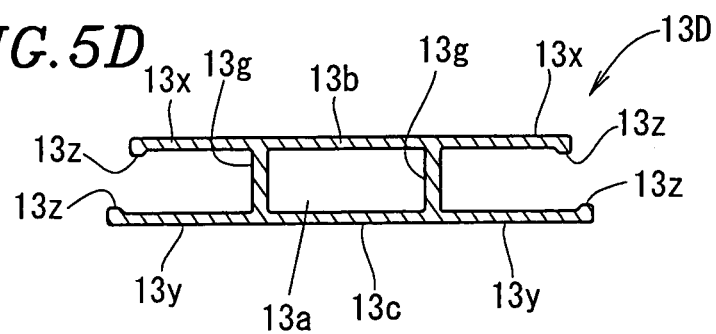

FIG. 5D shows a support member 13D. The support member 13D is substantially the same as the support member 13 shown in FIG. 4B except that the support body portion 13a of the support member 13D has a quadrangular cross-section. The amount of warp of the support member 13D is smaller than that of the support member 13 but is larger than that of the support member 13A (FIG. 5A). Like the support member 13A, the support member 13D is easily deformed while being cooled when produced by extrusion molding. In addition, as the portions 13g (modification of the triangular portions 13d and 13d') become thicker, the support member 13D becomes more rigid and the amount of warp thereof becomes smaller. However, the size of the portion which is engaged with the support part 11 becomes smaller. In consideration of the size of the portion engaged with the support part 11, the support member 13 is preferable to the support member 13D.

The amount of warp of the above-mentioned support members increases in the order of the support member 13B, the support member 13C, the support member 13A, the support member 13D, and the support member 13. Which support member is to be used may be determined in consideration of the weight, method of production (extrusion molding or other methods), ease of production, engagement with the support part 11 and the like as well as the amount of warp.

The support members 13, 13A and 13D having a hollow portion may also include a reinforcing rib 13e in the hollow portion as the support member 13C. The number of the reinforcing ribs 13e is not limited to any specific number.

Figure 6A:
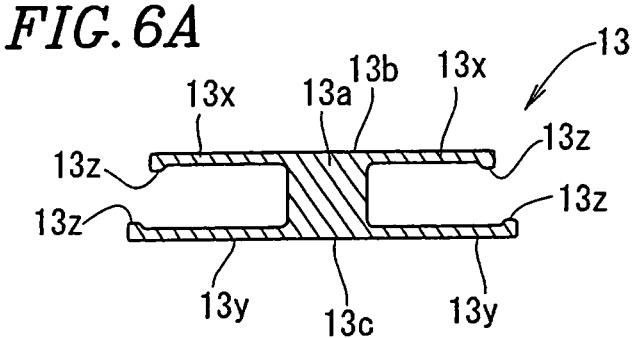
FIGS. 6A and 6B show other exemplary support members usable for the substrate accommodating tray shown in FIG. 2A.
Figure 6B:
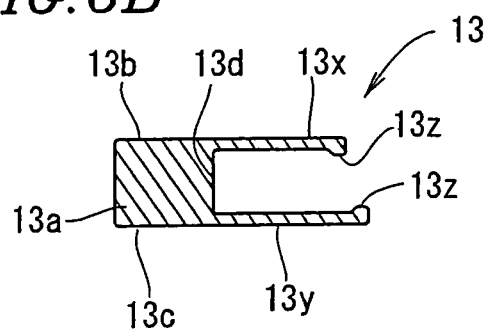

The support member may have a H-shaped cross-section (FIG. 6A) or a C-shaped cross-section (FIG. 6B).

As described above, which support member is to be used may be determined in consideration of the amount of warp, weight, method of production (extrusion molding or other methods), ease of production, engagement with the support part 11 and the like together with the conditions of use. The support member 13 is not limited to be engaged with side edges of the support parts 11, and may be engaged with, for example, bottom portions of the support parts 11.

In the above example, each support part 11 has a pair of grooves perpendicular to each other, such that each of the four support parts 11 can be placed in any corner of the frame 12 (FIG. 2A). Each support part 11 has the support member engaging section 11g (FIG. 3A) along each of two sides perpendicular to each other, and the frame engaging portion 11e and the upper projection portion 11f (FIG. 3A) along the other two sides. This arrangement is also provided such that each of the four support parts 11 can be placed in any corner of the frame 12 (FIG. 2A).

In the above example, the support element 110 includes four support parts 11. Two of the support parts 11 arranged side by side in the width direction (the support parts 11-1 and 11-2) are separated from another two support parts arranged side by side in the width direction (the support parts 11-3 and 11-4) by the first opening 10a. Furthermore, the support parts 11-1 and 11-2 are separated from each other by the second opening 10b, and the support parts 11-3 and 11-4 are separated from each other also by the second opening 10b. Alternatively, the support parts 11-1 and 11-2 may be integrally formed without being separated by the second opening 10b, and the support parts 11-3 and 11-4 may be integrally formed without being separated by the second opening 10b.

Figure 7:
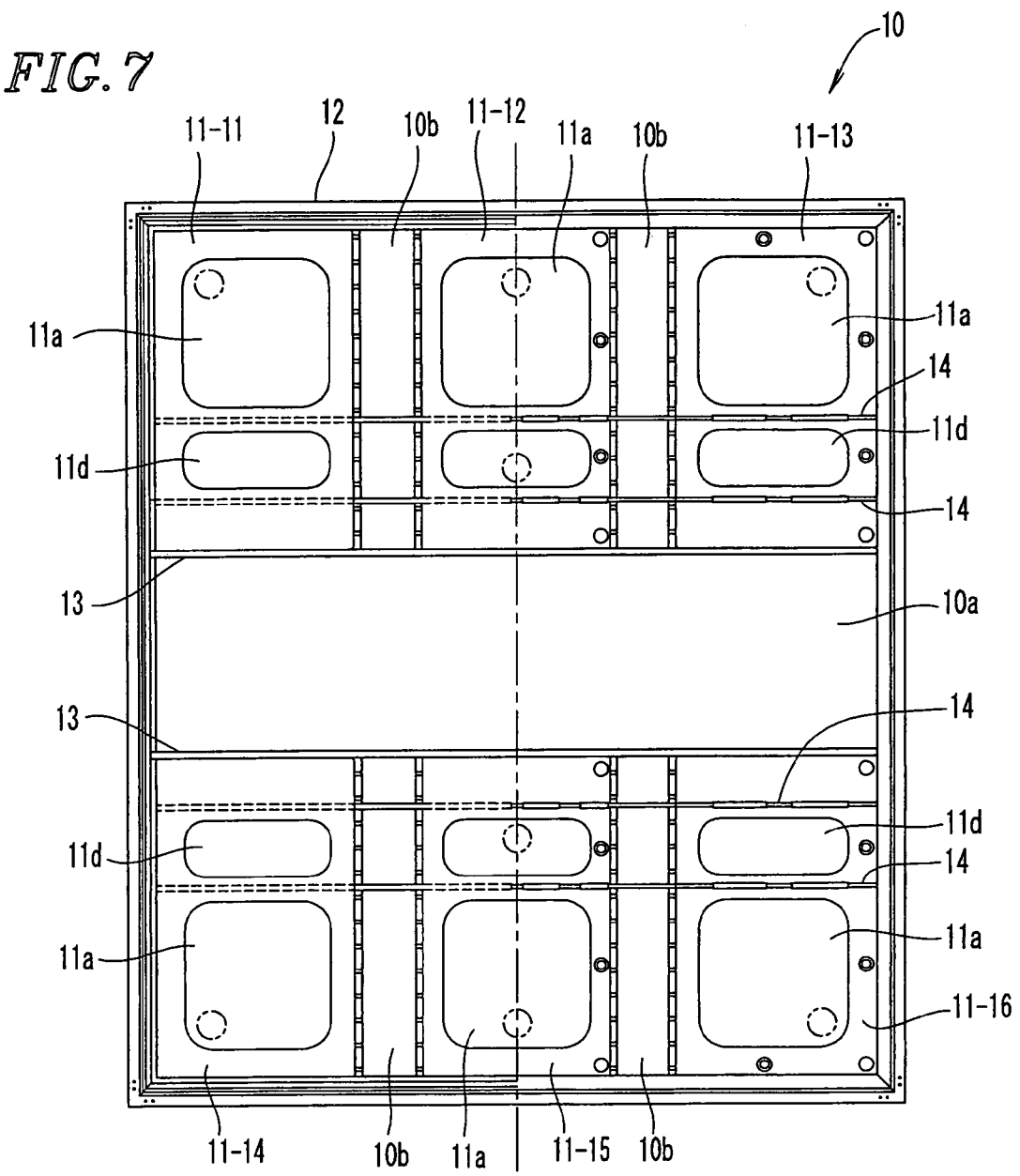
FIG. 7 is a plan view/bottom-view of another exemplary substrate accommodating tray according to the present invention.

Still alternatively, as shown in FIG. 7, the support element may include six support parts 11. Three of the support parts 11 arranged side by side in the width direction (the support parts 11-11, 11-12 and 11-13) are separated from another three support parts arranged side by side in the width direction (the support parts 11-14, 11-15 and 11-16) by the first opening 10a. Furthermore, the three support parts 11-11, 11-12 and 11-13 are separated from each other by the second openings 10b, and the support parts 11-14, 11-15 and 11-16 are separated from each other also by the second openings 10b. In this case, each support part 11 has only the first opening portion 11a and the fourth opening portion 11d and has neither the second opening portion 11b nor the third opening portion 11c.

For the other points, the support element shown in FIG. 7 is substantially the same as the support element 110 shown in FIG. 2A.

The number of reinforcing members 14 is not limited to two for a plurality of support parts 11 arranged side by side in the width direction as shown in FIG. 2A, but may be one or three or more for a plurality of support parts 11 arranged side by side in the width direction.

Still alternatively, as shown in FIG. 8, the support element may include nine support parts 11, which are grouped into three groups, each including three support parts 11. Three groups are separated from each other by the first openings 10a. Three support parts 11 in each group are separated from each other by the second openings 10b. One reinforcing member 14 is provided for each group. One support member 13 is provided along each edge of the three groups which runs along the first openings 10a. FIG. 8 is a conceptual view and the support element shown in FIG. 8 may have the same elements as those shown in FIGS. 1 and 2A, for example, the first opening portions 11a.

As described above, the number and the like of the support parts 11, the support members 13, the first and second openings 10a and 10b, and the reinforcing members 14 may be appropriately changed.

Figure 9A:
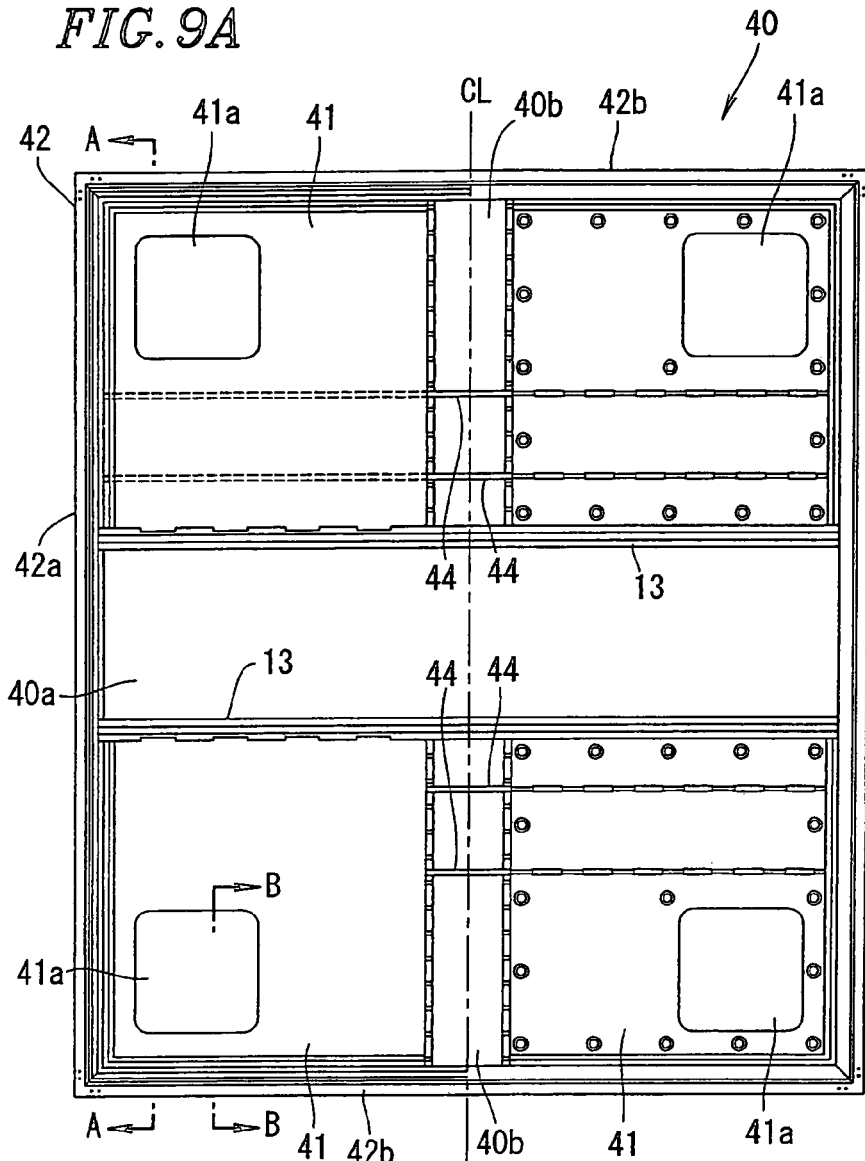
FIG. 9A is a plan view/bottom view of still another exemplary substrate accommodating tray according to the present invention.
Figure 9C:
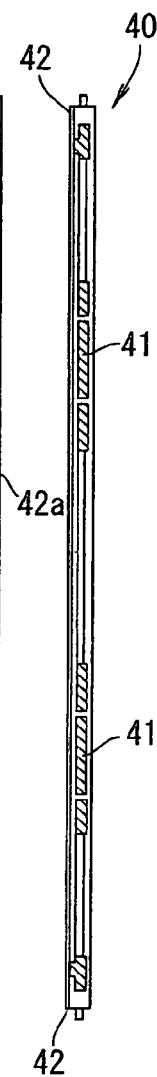
FIG. 9C is a cross-sectional view of the substrate accommodating tray shown in FIG. 9A taken along line A-A in FIG. 9A.
Figure 9B:
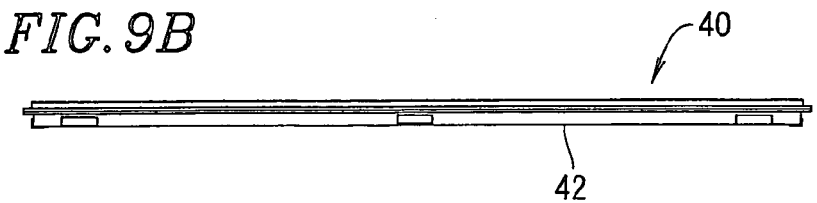
FIG. 9B is a side view of the substrate accommodating tray shown in FIG. 9A.

FIG. 9A is a plan view/bottom view of another exemplary substrate accommodating tray 40 according to the present invention. FIG. 9B is a side view thereof, and FIG. 9C is a cross-sectional view thereof taken along line A-A in FIG. 9A. In FIG. 9A, the left part from the central chain line CL shows the plan view, and the right part from the central chain line CL shows the bottom view.

The substrate accommodating tray 40 includes a quadrangular frame 42 (frame) and a support element including four support parts 41 which have a shape of a plate and are arranged at four corners of an area surrounded by the frame 42. A first opening 40a (first opening) and second openings 40b (second gaps) are formed between the support parts 41. One glass substrate is to be horizontally placed on the four support parts 41 for transportation.

Each support part 41 is substantially the same as the support part 11 shown in FIG. 2A except that the support part 41 does not have the second through fourth opening portions 11b through 11d and has only the first opening portion 41a (first opening). A pair of support members 13 are provided along the edges of the support parts 41 between two longitudinal direction portions 42a (pair of first frame portions) of the frame 42. The support members 13 have the same structure as the support members shown in one of FIGS. 4B, 5 and 6.

Like the support element 110 shown in FIG. 2A, each of two pairs of support parts 41 arranged side by side in the width direction include a pair of reinforcing members 44. The reinforcing members 44 run between the two longitudinal direction portions 42a.

Figure 10A:
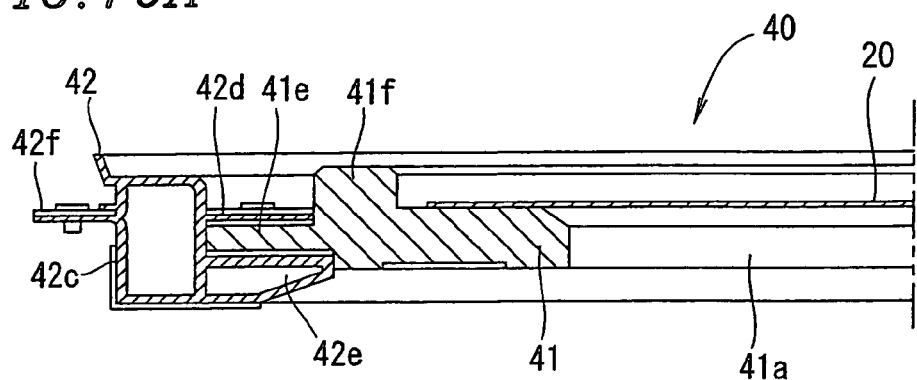
FIG. 10A is a partial cross-sectional view of the substrate accommodating tray shown in FIG. 9A.

The frame 42 is different from the frame shown in FIG. 2A in the structure of the cross-section. FIG. 10A is a cross-sectional view of the substrate accommodating tray 40 taken along line B-B in FIG. 9A. Although the cross-sectional view shown in FIG. 9A shows the longitudinal direction portion 12a of the frame 12, the width direction portion 12b of the frame 12 has substantially the same cross-sectional structure. Each support part 41 includes a frame engaging portion 41e. Although FIG. 10A shows the frame engaging portion 41e provided along the edge of the support part 41 along the longitudinal direction portion 42a of the frame 42, the support part 41 has a frame engaging portion 41e also along the edge of the support part 41 along a width direction portion 42b (second frame portion) of the frame 42. The support part 41 is engaged with the longitudinal direction portion 42a and the width direction portion 42b via each frame engaging portion 41e.

The support part 41 has an upper projection portion 41f which projects upward from an upper surface of the frame engaging portion 41e. Inside the upper projection portion 41f, the support part 41 has a flat upper surface which is at a slightly higher level than the upper surface of the frame engaging portion 41e and at a lower level than an upper surface of the upper projection portion 41f. On this upper surface inside the upper projection portion 41f, a glass substrate 20 is to be placed.

The longitudinal direction portion 42a and the width direction portion 42b have substantially the same cross-sectional structure as described above, and are formed by molding aluminum or the like. The longitudinal direction portion 42a and the width direction portion 42b each include a frame body portion 42c along the entire length thereof. The frame body portion 42c is a hollow rectangular parallelepiped and is in contact with a side surface of the frame engaging portion 41e. The frame body portion 42c extends upward from the upper surface of the frame engaging portion 41e and downward from the lower surface of the frame engaging portion 41e. A top end of the frame body portion 42c is higher than the upper surface of the upper projection portion 41f. A lower surface of the frame body portion 42c is lower than a lower surface of the support part 41.

Each of the longitudinal direction portion 42a and the width direction portion 42b includes an upper surface engaging portion 42d and a lower surface engaging portion 42e. The upper surface engaging portion 42d is in contact with the upper surface of the frame engaging portion 41e and is horizontal and strip-shaped. The upper surface engaging portion 42d is provided along the entire length of the longitudinal direction portion 42a and the width direction portion 42b. The lower surface engaging portion 42e is in contact with the lower surface of the frame engaging portion 41e. The lower surface engaging portion 42e is attached to a lower portion of the frame body portion 42c. The lower surface engaging portion 42e is hollow and has a trapezoidal cross-section, and is tapered along an inner lower surface.

Each of the longitudinal direction portion 42a and the width direction portion 42b includes a flange 42f along the entire length thereof. The flange 42f projects outward. The flange 42f is at substantially the same level as the upper engaging portion 42d but projects in the opposite direction. The flange 42f is, for example, to be engaged with chucks or claws of a chucking device when the substrate accommodating tray 40 is horizontally transported.

Figure 10B:
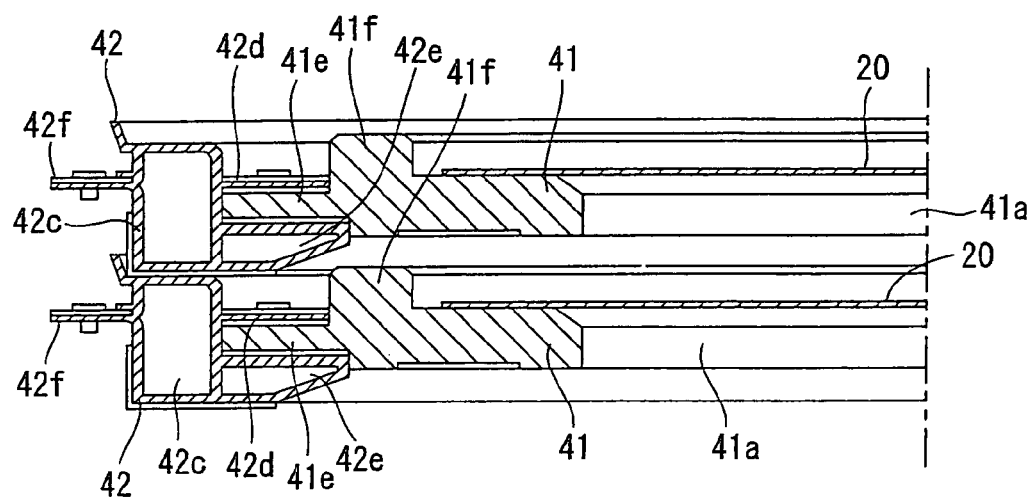
FIG. 10B is a partial cross-sectional view of a plurality of substrate accommodating trays vertically stacked together, each of which is shown in FIG. 9A.

The substrate accommodating tray 40 is structured such that a plurality of substrate accommodating trays 40 can be vertically stacked. For vertically stacking the plurality of substrate accommodating trays 40, as shown in FIG. 10B, the lower surface of the frame body portion 42c of the frame 42 of an overlying substrate accommodating tray 40 is engaged with, and thus supported by, an upper surface of the frame body portion 42c of the frame 42 of an underlying substrate accommodating tray 40. The above-mentioned upper surface and the lower surface can be positioned to each other.

The substrate accommodating tray 40 has substantially the same functions as those of the substrate accommodating tray 10. Since the frame body portion 42c is a hollow rectangular parallelepiped, the frame 42 has an improved rigidity and thus can support the glass substrate 20 more stably.

FIG. 11 is an isometric view of still another exemplary substrate accommodating tray 50 according to the present invention; FIG. 12A is a plan view/bottom view thereof; FIG. 12B is a side view thereof; FIG. 12C is a cross-sectional view thereof taken along line A-A in FIG. 12A; and FIG. 12D is a partial enlarged view of the cross-section shown in FIG. 12C. In FIG. 12A, the left part from the central chain line CL shows the plan view, and the right part from the central chain line CL shows the bottom view.

The substrate accommodating tray 50 includes one support element 51 having the shape of a rectangular plate having a thickness of about 15 mm, and a quadrangular frame 52 engaged with the support element 51 along the entire periphery of the support element 51. The substrate accommodating tray 50 is formed of an elastic foamed synthetic resin material such as, for example, a foamed polyethylene resin. On the support element 51, a glass substrate 20 is horizontally placed to be transported.

The support element 51 has a square opening portion 51a at each of four corners and a center thereof. The support element 51 also has a square opening portion 51a at the center of four sides thereof. These nine opening portions 51a are provided for receiving removing pins. The removing pins are inserted into the opening portions 51a for raising the glass substrate 20 placed on the support element 51 and removing the glass substrate 20 from the substrate accommodating tray 50.

Owing to the engagement of the frame 52 with the support element 51 along the entire periphery of the support element 51 formed of an elastic foamed synthetic resin material, the substrate accommodating tray 50 has an improved rigidity than a tray formed only of a foamed synthetic resin material. The support element 51 inside the frame 52 is not divided and thus can be produced without using any support member 13 or reinforcing member 14 for connecting divided portions of the support element 51.

Even in the case where the support element 51 inside the frame 52 is not divided, one or a plurality of reinforcing members formed of, for example, an aluminum pipe may be provided in the support element 51. The reinforcing member(s) should be provided so as not to be exposed to the surface of the support element 51.

In the above examples, substrate accommodating trays for accommodating a glass substrate 20 for a liquid crystal display panel have been described. A substrate accommodating tray according to the present invention may accommodate a glass substrate for other types of display panels or may accommodate other types of substrates, for example, a synthetic resin substrate.

According to the present invention, a plurality of substrate accommodating trays can be stacked vertically while each substrate accommodating tray accommodates one display substrate. Therefore, the substrates accommodated in the substrate accommodating trays do not contact each other.

Since the support element has a plurality of openings, the substrate accommodated in the tray may be removed using the removing pins which are inserted into the openings. Owing to such a structure, the substrate accommodating tray does not need to have any special space for inserting the adsorption pads from a side surface of the substrate accommodating tray. This reduces the thickness of the substrate accommodating tray and increases the space efficiency for transportation and storage.

When stacked vertically, a great number of substrate accommodating trays can be transported and stored as one unit. It is also possible to handle each substrate accommodating tray individually. For example, an individual substrate accommodating tray can be handled by only one worker. Thus, the substrate accommodating trays are easy to handle.

In addition, the support element provided for placing a substrate inside the frame improves the rigidity of the substrate accommodating tray. A thin and large-area substrate can be accommodated with certainty without warping. A great number of such substrate accommodating trays can be vertically stacked together.

Since the support element is divided into a plurality of parts, the substrate accommodating tray is lightweight and is produced at lower cost. The divided parts of the support element, which are connected by a support member, are prevented from being reduced in rigidity. Each part of the support element, even if reduced in thickness, is not warped. Thus, a thin and large-area substrate can be accommodated with certainty without warping.

The support member has an upper flange portion and a lower flange portion with a space therebetween on at least one side of the straight beam-like support body portion. The support member is thus increased in rigidity, and is prevented from warping. Since a side edge of the support element is in engagement between the upper flange portion and the lower flange portion, the support element is prevented with certainty from warping. As a result, even when a large-area and easily warped substrate is placed on the support element, the support element is prevented with certainty from warping.

As described above, a substrate accommodating tray according to the present invention is especially useful for accommodating a substrate such as a large glass substrate used for a display panel in a liquid crystal display device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A substrate accommodating tray for accommodating a substrate, the substrate accommodating tray comprising:
a frame including a pair of first frame portions facing each other and a pair of second frame portions facing each other, the frame being defined by top side, bottom side, and two sides,
wherein each pair of first and second frame portions support a plate-like support element, in a same plane as the frame, for supporting the substrate, wherein the pair of first frame portions are the side of the frame and the pair of second frame portions are the top side and bottom side of the frame wherein the pair of first frame portions are the side of the frame and the pair of second frame portions are the top side and bottom side of the frame, the pair of first frame portion are connected with a first support member and a second support member,
wherein the first support member and the second support member extend from one side of the frame to the other side of the frame and parallel to the top and bottom sides of the frame, the first support member and the second support member are separated by a first opening which extends parallel to the top and bottom sides of the frame, and
wherein the first opening is located in the middle of the frame and penetrates through an entire support element from a first side of the support element to a second side of the support element opposite the first side, the first side of the support element for placing the substrate on.

2. A substrate accommodating tray according to claim 1, wherein the support element has a second opening provided between the pair of second frame portions.

3. A substrate accommodating tray according to claim 1, wherein the support element contains a foamed synthetic resin.

4. A substrate accommodating tray according to claim 1, wherein the frame and the first and second support members each contain aluminum.

5. A substrate accommodating tray according to claim 1, further comprising: at least one reinforcing member for reinforcing the support element, the at least one reinforcing member being provided in the support element.

6. A substrate accommodating tray according to claim 1, wherein the support element further has a plurality of openings respectively provided in the vicinity of a plurality of corners of the frame.

7. A substrate accommodating tray according to claim 1, wherein: the pair of first frame portions are substantially parallel to each other, the pair of first frame portions and the pair of second frame portions are substantially perpendicular to each other, and the frame is a quadrangular frame.

8. A substrate accommodating tray for accommodating a substrate, the substrate accommodating tray comprising:
a frame including a pair of first frame portions facing each other and a pair of second frame portions facing each other, the frame being defined by top side, bottom side, and two sides,
wherein each pair of first and second frame portions support a plate-like support element, in a same plane as the frame, for supporting the substrate, wherein the pair of first frame portions are the side of the frame and the pair of second frame portions are the top side and bottom side of the frame wherein the pair of first frame portions are the side of the frame and the pair of second frame portions are the top side and bottom side of the frame, the pair of first frame portion are connected with a first support member and a second support member,
wherein the first support member and the second support member extend from one side of the frame to the other side of the frame and parallel to the top and bottom sides of the frame, the first support member and the second support member are separated by a first opening which extends parallel to the top and bottom sides of the frame,
wherein the first opening is located in the middle of the frame and penetrates through an entire support element from a first side of the support element to a second side of the support element opposite the first side, the first side of the support element for placing the substrate on, and
wherein the first support member and the second support member are provided so as not to project over an upper surface of the support element.

9. A substrate accommodating tray for accommodating a substrate, the substrate accommodating tray comprising:
a frame including a pair of first frame portions facing each other and a pair of second frame portions facing each other, the frame being defined by top side, bottom side, and two sides,
wherein each pair of first and second frame portions support a plate-like support element, in a same plane as the frame, for supporting the substrate, wherein the pair of first frame portions are the side of the frame and the pair of second frame portions are the top side and bottom side of the frame wherein the pair of first frame portions are the side of the frame and the pair of second frame portions are the top side and bottom side of the frame, the pair of first frame portion are connected with a first support member and a second support member,
wherein the first support member and the second support member extend from one side of the frame to the other side of the frame and parallel to the top and bottom sides of the frame, the first support member and the second support member are separated by a first opening which extends parallel to the top and bottom sides of the frame, and wherein the first opening is located in the middle of the frame and penetrates through an entire support element from a first side of the support element to a second side of the support element opposite the first side, the first side of the support element for placing the substrate on, at least one reinforcing member for reinforcing the support element, the at least one reinforcing member being provided in the support element, wherein the at least one reinforcing member is provided in the support element so as not to be exposed to the first surface of the support element.

10. A substrate accommodating tray for accommodating tray comprising:
a frame including a pair of first frame portions facing each other and a pair of second frame portions facing each other, the frame being defined by top side, bottom side, and two sides, wherein each pair of first and second frame portions support a plate-like support element for supporting the substrate, wherein the pair of first frame portion are the side of the frame and the pair of second frame portion are the top side and bottom side of the frame wherein the pair of first frame portions are the side of the frame and the pair of second frame portions are the top side and bottom side of the frame, the pair of first frame portion are connected with a first support member and a second support member, wherein the first support member and the second support member extend from one side of the frame to the other side of the frame and parallel to the top and bottom sides of the frame, the first support member and the second support member are separated by a first opening which extends parallel to the top and bottom sides of the frame, wherein the first opening is located in the middle of the frame and penetrates through an entire support element from a first side of the support element to a second side of the support element opposite the first side, the first side of the support element for placing the substrate on, and at least one reinforcing member for reinforcing the support element, the at least one reinforcing member being provided in the support element, wherein the at least one reinforcing member includes an aluminum pipe.

11. A substrate accommodating tray for accommodating a substrate, the substrate accommodating tray comprising:
a frame including a pair of first frame portions facing each other and a pair of second frame portions facing each other, the frame being defined by top side, bottom side, and two sides, wherein each pair of first and second frame portions support a plate-like support element, in a same plane as the frame, for supporting the substrate, wherein the pair of first frame portions are the side of the frame and the pair of second frame portions are the top side and bottom side of the frame wherein the pair of first frame portions are the side of the frame and the pair of second frame portions are the top side and bottom side of the frame, the pair of first frame portion are connected with a first support member and a second support member, wherein the first support member and the second support member extend from one side of the frame to the other side of the frame and parallel to the top and bottom sides of the frame, the first support member and the second support member are separated by a first opening which extends parallel to the top and bottom sides of the frame, and wherein the first opening is located in the middle of the frame and penetrates through an entire support element from a first side of the support element to a second side of the support element opposite the first side, the first side of the support element for placing the substrate on, wherein the first and second support members include:
a straight beam like support body portion;
a first upper flange portion provided at an upper position on one side of the support body portion;
a first upper flange portion provided at an upper position on the other side of the support body portion; and
a first lower flange portion provided at a lower position on the other side of the support body portion,
wherein the first upper flange portion and the first lower flange portion have a space therebetween.

12. A substrate accommodating tray according to claim 11, wherein the support body portion has a trapezoidal cross-section.

13. A substrate accommodating tray according to claim 11, wherein the support body portion is hollow.

14. A substrate accommodating tray according to claim 13, wherein the first and second support members further include a reinforcing rib provided in the support body portion substantially vertically to a planar direction of the support element.

15. A substrate accommodating tray according to claim 11, wherein the first and second support members further include:
a second upper flange portion provided at an upper position on the other side of the support body portion; and a second lower flange portion provided at a lower position on the other side of the support body portion, wherein the second upper flange portion and the second lower flange portion have a space therebetween.

16. A substrate accommodating tray according to claim 15, wherein the support body portion has a trapezoidal cross-section.

17. A substrate accommodating tray according to claim 15, wherein the support body portion is hollow.

18. A substrate accommodating tray according to claim 17, wherein the first and second support members further include a reinforcing rib provided in the support body portion substantially vertically to a planar direction of the support element.

19. A substrate accommodating tray for accommodating a substrate, the substrate accommodating tray comprising:
a frame including a pair of first frame portions facing each other and a pair of second frame portions facing each other, and the frame portion being defined by top side, bottom side, and two sides, wherein each pair of first and second frame portions supports a plate-like support element, in a same plane as the frame, for supporting the substrate, wherein the pair of first frame portions are the side of the frame and the pair of second frame portions are the top side and bottom side of the frame wherein the pair of first frame portions are the side of the frame and the pair of second frame portions are the top side and bottom side of the frame, the pair of first frame portions are connected with a first support member a second support member, wherein the first support member and second support member extend from one of the first pair of first frame portions to the other of the pair of first frame portions and parallel to the top and bottom sides of the pair of second frame portions, the first support member and the second support member are divided by first opening which extends parallel to the top and bottom sides and of the pair of second frame portions and wherein the first opening is located in the middle of the frame,
wherein the first opening penetrates through the entire support element from a first side of the support element to a second side of the support element opposite the first side, the first side of the support element for placing the substrate on.

* * * * *